United States Patent [19]

Swensen

[11] 4,284,885
[45] Aug. 18, 1981

[54] OPTICAL POTENTIOMETER

[75] Inventor: Eugene T. Swensen, Golden Valley, Minn.

[73] Assignee: Honeywell Inc., Minneapolis, Minn.

[21] Appl. No.: 29,250

[22] Filed: Apr. 12, 1979

Related U.S. Application Data

[63] Continuation-in-part of Ser. No. 910,043, May 26, 1978, abandoned.

[51] Int. Cl.³ .............................................. G01J 1/32
[52] U.S. Cl. ................................ 250/211 K; 250/229
[58] Field of Search ............ 250/211 K, 229, 231 SE; 340/365 P; 324/175

[56] References Cited

U.S. PATENT DOCUMENTS

| | | |
|---|---|---|
| 3,171,034 | 2/1965 | Tomasulo et al. ......... 250/211 K X |
| 3,194,967 | 7/1965 | Mash . |
| 3,246,161 | 4/1966 | Matare et al. . |
| 3,258,601 | 6/1966 | Suleski . |
| 3,358,150 | 12/1967 | Summer . |
| 3,414,730 | 12/1968 | Nicolas . |
| 3,539,816 | 11/1970 | Chamberlin . |
| 3,639,769 | 2/1972 | Clark . |
| 3,811,047 | 5/1974 | Shragal . |
| 3,859,617 | 1/1975 | Oka et al. . |
| 3,892,961 | 7/1975 | Bachmann . |

*Primary Examiner*—David C. Nelms
*Assistant Examiner*—Darwin R. Hostetter
*Attorney, Agent, or Firm*—Trevor B. Joike

[57] ABSTRACT

An optical potentiometer is disclosed having first and second variably light transmissive windows, a source of light mounted on one side of the windows and corresponding first and second light responsive devices mounted on the other side of the window in such a fashion that only one of the light responsive devices receives energizing light at a time, and a handle for moving first and second variable light transmissive windows past the corresponding first and second light responsive devices. A dwell period may be provided between the times when the first and second light responsive devices receive energizing light.

30 Claims, 11 Drawing Figures

OPTICAL POTENTIOMETER

This application is a continuation-in-part of application Ser. No. 910,043 filed May 26, 1978, now abandoned.

BACKGROUND OF THE INVENTION

This invention relates to an optical potentiometer and, more particularly, to a potentiometer having two light responsive devices only one of which is energized at a time and where a dwell period may be provided between the times that the two light responsive devices receive energizing light.

Variable resistors are used extensively for providing control and setpoint functions in electrical circuits. For example, variable resistors are used as motor speed and light intensity controls, as trimming and compensating resistors in electrical apparatus, and for setpoint control in electrical condition controlling circuits. Most prior art variable resistors comprise a fixed resistance element and a slidable wiper arm which is in mechanical contact with the fixed resistance and wipes over the resistance to provide a variable output voltage between the voltages to which the ends of the fixed resistance are connected.

In such devices, good electrical contact between the wiper arm and the fixed resistance must be maintained to prevent degradation of the output voltage supplied by the wiper arm and to maintain the connection between the fixed resistance and the circuit to which the wiper arm is connected. The friction resulting from the wiping motion of the wiper arm over the fixed resistance results in wearing of the contact point between the wiper arm and the fixed resistance potentially weakening the contact point and leading to a break and subsequent open circuit condition. Moreover, this wearing and any oxydation to which the contact point may be subjected tends to generate undesirable electrical noise.

To avoid the problems of a direct electrical contact between the wiper arm and the fixed resistance, the prior art turned to optical potentiometers. However, the optical potentiometers of the prior art duplicates the same operating characteristics of resistance type potentiometers and, therefore, have all of the built-in inflexibilities of such resistance type potentiometers. Specifically, in resistance type potentiometers, as the wiper arm travels over the resistance, the resistance between the wiper arm and the two ends of the potentiometer changes, although the total resistance remains fixed. Similarly, in known optical potentiometers, the photocells are varied inversely and simultaneously as the control dial is rotated in either direction. Such devices may be useful in many applications but there are many more in which it would be desirable to have only one of the photocells receive energizing light at the time.

SUMMARY OF THE INVENTION

The optical potentiometer of the present invention has first and second variable light transmissive windows, a light source mounted on one side of the windows, first and second corresponding light responsive devices mounted on the other side of the respective variable light transmissive windows, the first and second light responsive devices mounted so that only one of them receives energizing light at a time, and a mechanism for moving the first and second variable light transmissive windows past their corresponding first and second light responsive devices.

BRIEF DESCRIPTION OF THE DRAWINGS

These and other features and advantages will become apparent from a detailed consideration of the invention when taken in conjunction with the drawings in which.

DETAILED DESCRIPTION OF THE DRAWINGS

Figure 3:
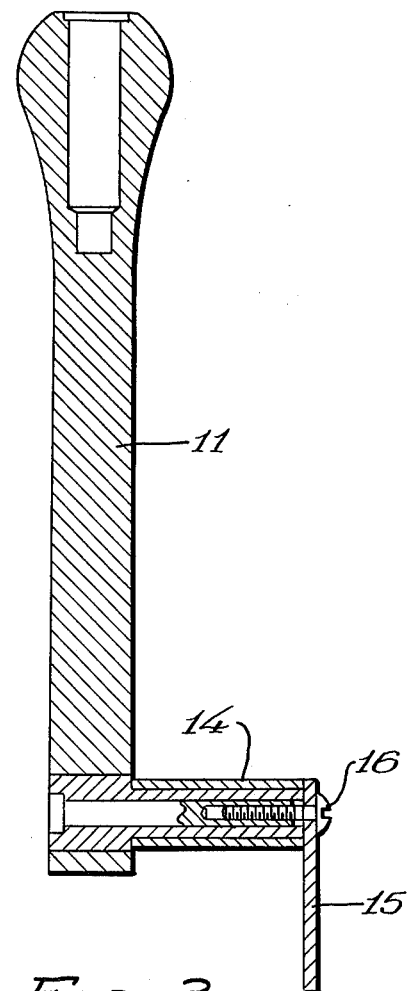
FIG. 3 shows the operating control handle connected to the disc supporting the variable light transmissive windows.

The control handle 10 is a three-part assembly comprising an operator's handle 11, a housing 12 for the optics portion of the invention and a housing 13 for the electronics portion. Operator's handle 11 is rotatably secured to housing 12 by any suitable means and, as shown in FIG. 3, has a shaft 14 for extending through and into the interior of housing 12 for corresponding rotating disc 15 upon which the first and second variable light transmissive windows are located. Disc 15 may be attached to shaft 14 by any suitable means such as bolt 16. Housing 12 has molded therein stops 16 and 17 for limiting the rotational travel of the operator's handle 11 by a fixed amount in either direction. Housing 12 may be secured to housing 13 by any suitable means such as bolts 18 and housing 13 has flange portions 22 which may have suitable holes located therein for receiving bolts to clamp control handle 10 to any other suitable assembly.

Figure 1:
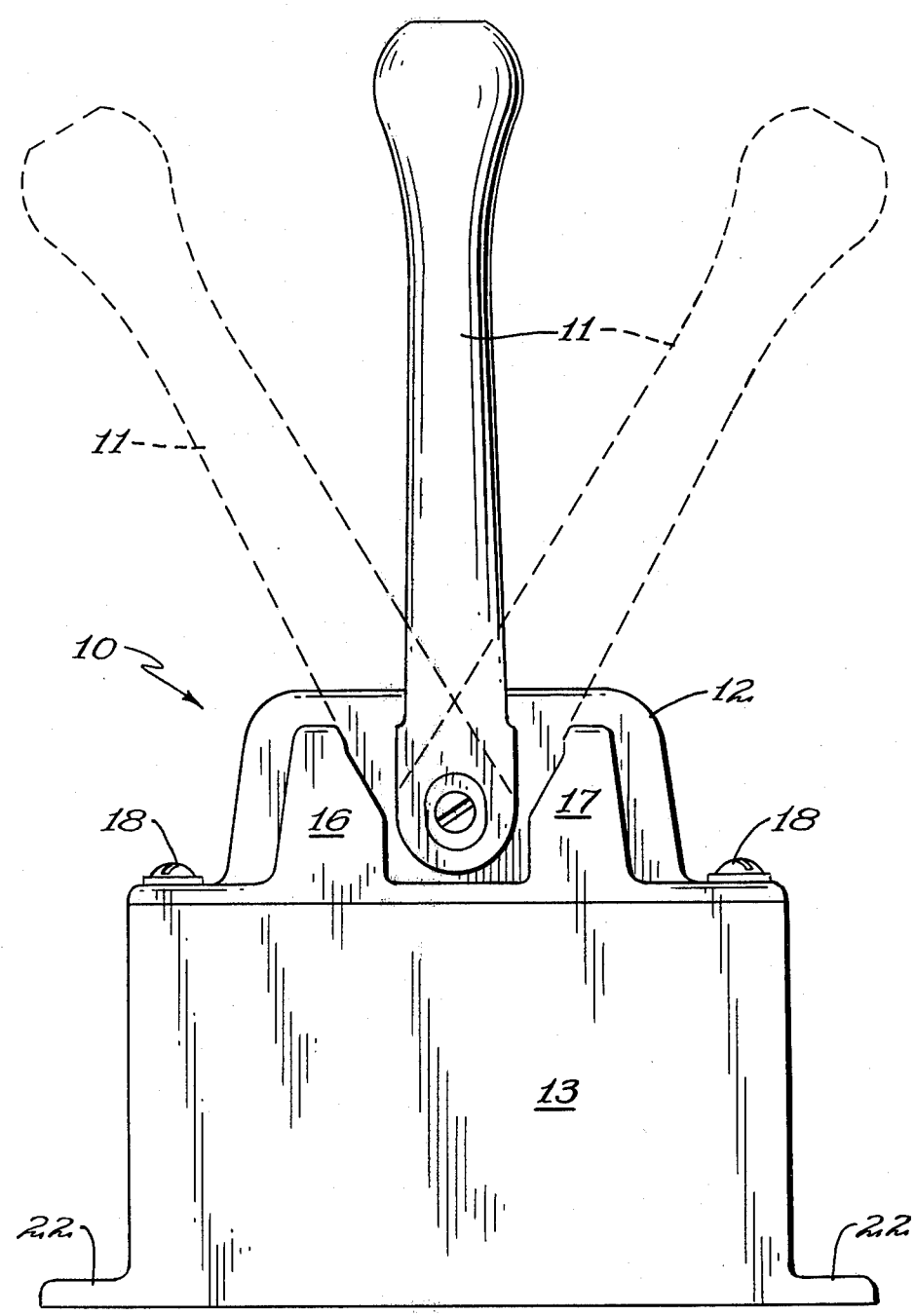
FIG. 1 is a front view of the control handle which houses the optical potentiometer according to the present invention.
Figure 4:
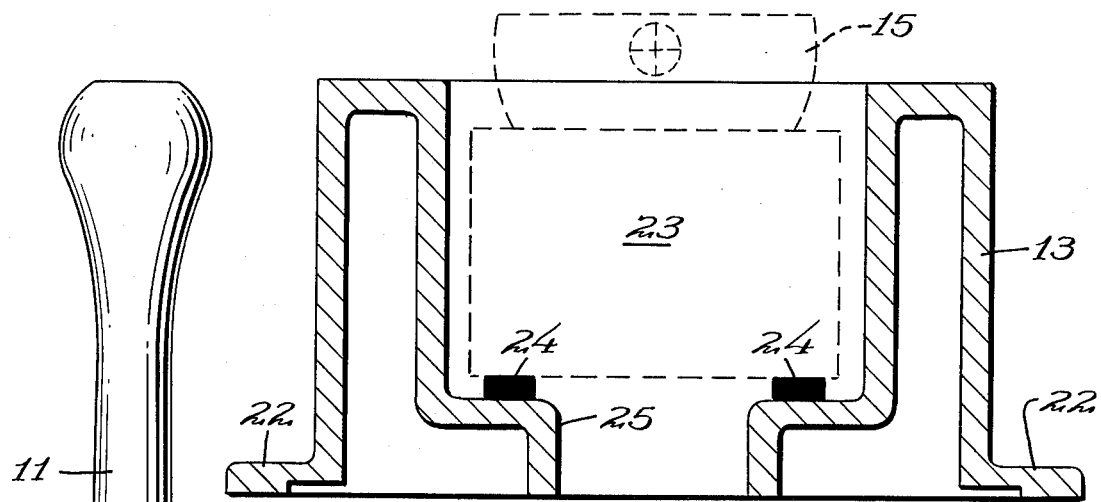
FIG. 4 is a cross-sectional view of the lower housing of the control handle shown in FIGS. 1 and 2.
Figure 2:
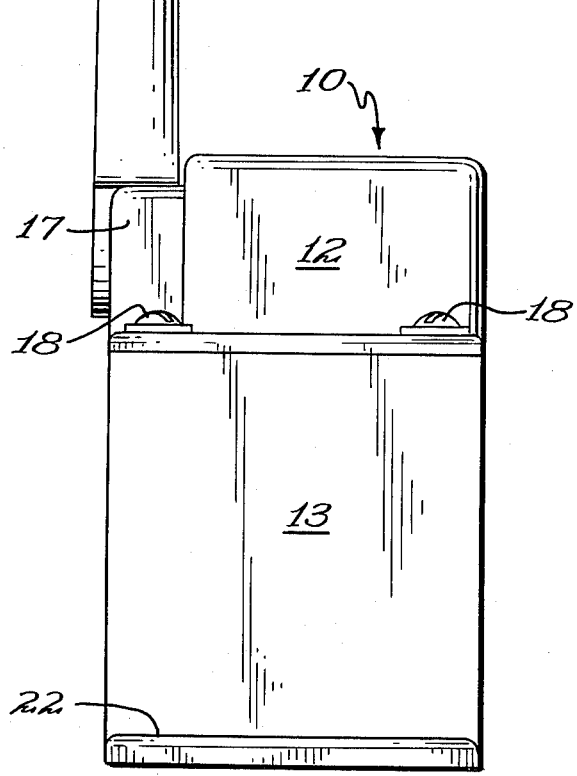
FIG. 2 is a rear view of the control handle shown in FIG. 1.
Figure 8:
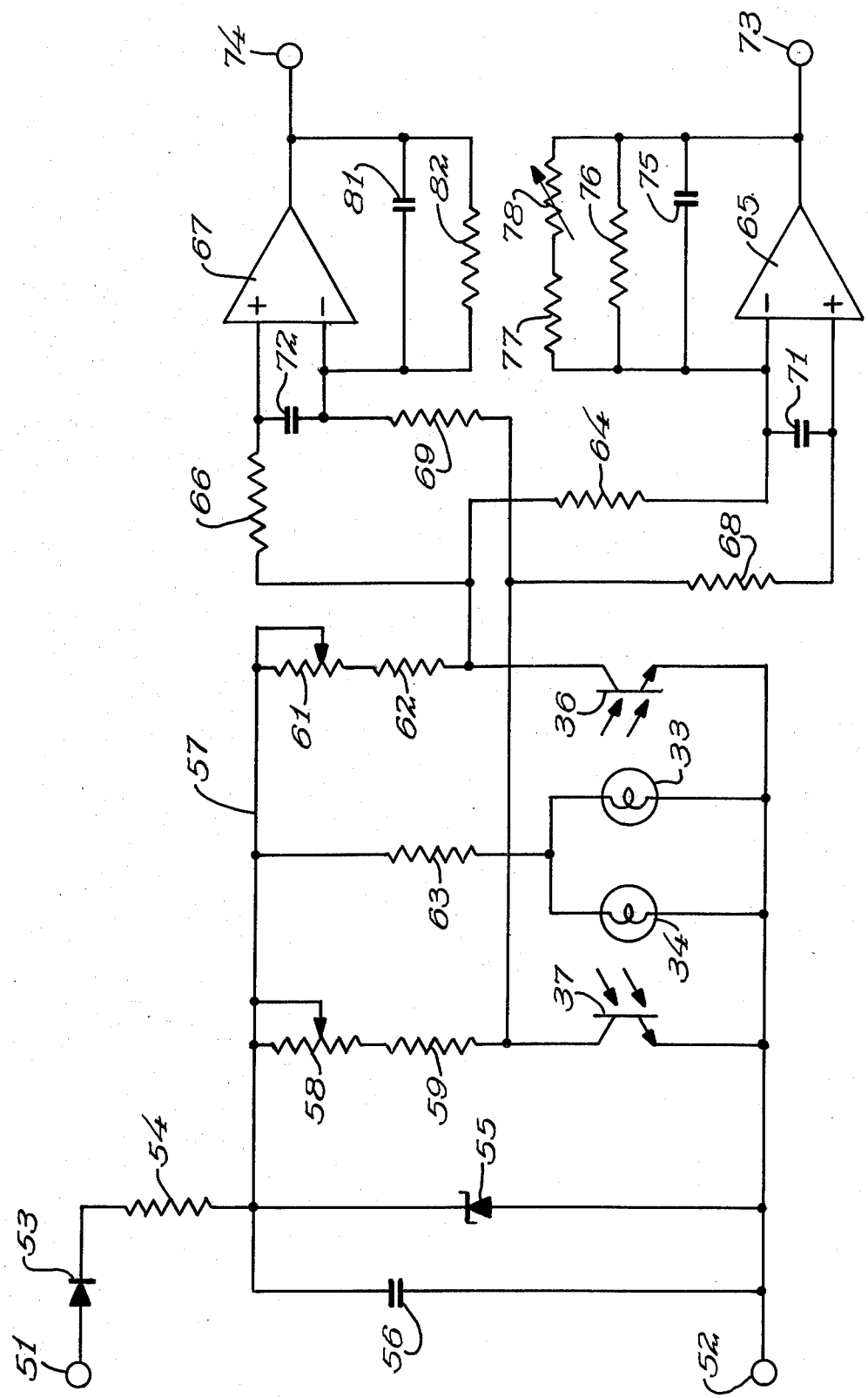
FIG. 8 shows the circuit for providing a differential output in response to the energization of the photoresponsive devices.

The circuit shown in FIG. 8 may be mounted on a printed circuit board for insertion into housing 13 as shown in FIG. 4. In particular, the printed circuit board 23 may be supported within lower part 13 of the housing by any suitable means and may have spacers 24 for supporting printed circuit board 23 to and electrically isolating it from circumferential ledge 25 of housing 13. Thus, printed circuit board 23 is maintained stationary within housing 13 while disc 15 is rotated by operator's handle 11 with respect to printed circuit board 23.

Figure 7:
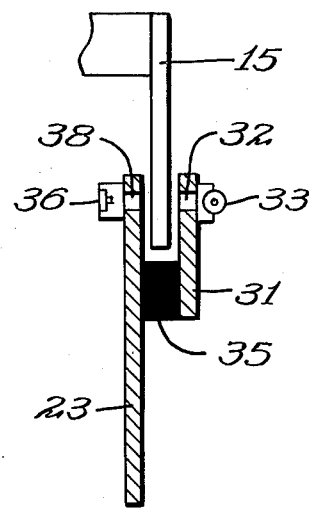
FIG. 7 shows the disc mounted between the light source and one of the photoresponsive devices.
Figure 6:
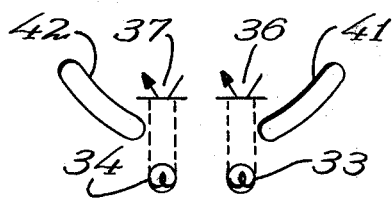
FIG. 6 shows the relationship between the windows, the light sources and the photoresponsive devices.

The relationship between printed circuit board 23 and disc 15 is better shown in FIG. 7. The source of light is comprised of two bulbs which, in the alternative, may be LEDs. The bulbs are supported by board 31 which allows the light to shine through board 31 by corresponding holes 32. One bulb 33 is shown in FIG. 7 which is associated with holes 32 in board 32. The other bulb 34 will have a similar corresponding hole 32 in board 31. Board 31 is supported by and spaced away from printed circuit board 23 by spacer 35. Printed circuit board 23 supports both of the light responsive devices 36 and 37 which may be in the form of photoresponsive transistors. Only one of the photoresponsive transistors 36 is shown in FIG. 7 supported by printed circuit board 23 and it receives its light through a hole 38 in printed circuit board 23. The photoresponsive transistor 37 will have a corresponding hole in printed circuit board 23 for receiving light from its corresponding source of light 34. Disc 15 is rotated between printed circuit board 23 and board 31 for controlling the amount of light impinging upon photoresponsive transistors 36 and 37 from their corresponding sources of light 33 and 34.

Figure 5:
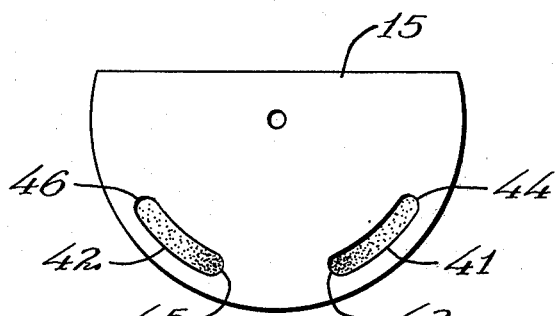
FIG. 5 shows the disc on which are mounted the two variable light transmissive windows.

Disc 15 is shown with more particularity in FIG. 5 and comprises a first window 41 and a second window 42 for controlling the amount of light supplied by sources 33 and 34 and received by corresponding phototransistors 36 and 37. As can be seen from FIG. 5, end 43 of window 41 facing window 42 is more heavily opaque than end 44. That is, window 31 becomes increasingly transparent as end 44 is approached. The gradient of transparency may be adjusted to provide any desired result, such as a sine or cosine function, or may be linear. Similarly, end 45 of window 42, facing end 43 of window 41, is more opaque than end 46 with the transparency increasing from end 45 to end 46.

Figure 9:
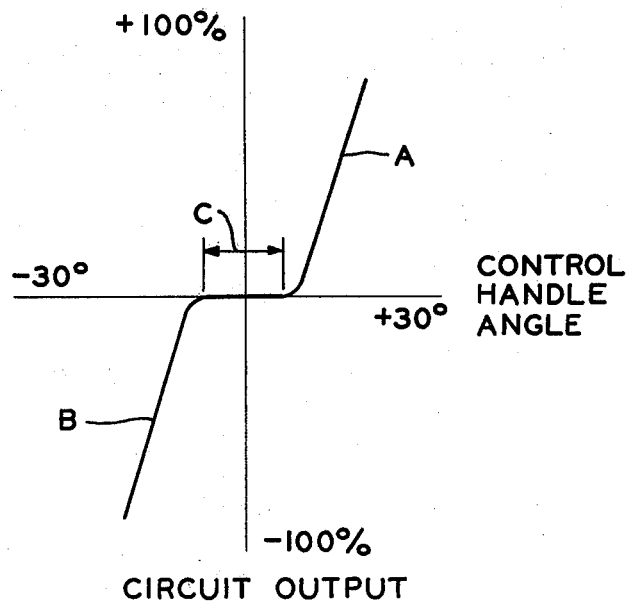
FIG. 9 shows the output from the circuit of FIG. 8 as the control handle is rotated.

The distance between windows 41 and 42 and the positions of each photopair 33–36 and 34–37 with respect to their corresponding windows 41 and 42 may be adjusted to provide any desired dwell period between the time when phototransistor 36 receives light and the time when phototransistor 37 receives light. Specifically, as disc 15 is rotated clockwise from its center position, window 41 is moved between source 33 and the receiver 36 to control the amount of energization of phototransistor 36. During this time, phototransistor 37 does not receive light from source 34. On the other hand, when disc 15 is rotated in a counter-clockwise direction from its center position, window 42 controls the amount of light received by phototransistor 37 whereas phototransistor 36 receives no light. For example, the interrelationship between the distances between windows 41 and 42 and their corresponding optical pairs may be adjusted to provide the kind of response as shown in FIG. 9. Portion A of the curve represents the energization of phototransistor 36 and portion B of the curve represents energization of phototransistor 37. The circuit of FIG. 8 is designed to provide the kind of response shown in FIG. 9 and the dwell period C during which neither phototransistor 36 nor phototransistor 37 is energized may be predetermined by preselecting the aforementioned distances.

The circuit is shown in FIG. 8 and may comprise input terminals 51 and 52 which may be connected to a suitable source of power such as the 12-volt battery of a vehicle upon which the disclosed control handle 10 may be used. Terminal 51 is connected through the forward junction of diode 53 and resistor 54 to one side of zener diode 55 the other side of which is connected to terminal 52. Capacitor 56 is connected in parallel with zener diode 55. The zener diode 55 establishes a regulated voltage on line 57 which supplies the optical circuit as shown. Connected in parallel with zener diode 55 is a series connected circuit comprised of rheostat 58, resistor 59 and the collector and emitter electrodes of photoresponsive transistor 37. Also connected in parallel to zener diode 55 is the series connected circuit comprising rheostat 61, resistor 62 and the collector and emitter terminals of photoresponsive transistor 36. Further connected across zener diode 55 is resistor 63 connected in series with the parallel combination of light sources 33 and 34.

The collector of photoresponsive transistor 36 is connected through resistor 64 to the negative input terminal of amplifier 65 and is also connected through resistor 66 to the positive input terminal of amplifier 67. The collector of photoresponsive transistor 37 is connected through resistor 68 to the positive input terminal of amplifier 65 and is also connected through resistor 69 to the negative input terminal of amplifier 67. Capacitor 71 is connected between the positive and negative input terminals of amplifier 65 and capacitor 72 is connected between the positive and negative input terminals of amplifier 67. Connected between the negative input terminal of amplifier 65 and its output terminal 73 are a capacitor 75 connected in parallel to resistor 76 connected in parallel to the series combination of resistor 77 and temperature compensating resistor 78. Connected between the negative input terminal of amplifier 67 and its output terminal 74 is the parallel combination of capacitor 81 and resistor 82.

This arrangement is designed to provide a differential output between terminals 73 and 74. When disc 15 is in its center position so that neither photoresponsive transistor 36 nor photoresponsive transistor 37 is receiving light from their corresponding light sources 33 and 34, the difference in voltage between terminals 73 and 74 is essentially zero. As disc 15 is rotated in a clockwise direction, light from source 33 begins impinging upon photoresponsive transistor 36 lowering the potential of its collector. Amplifier 65 inverts this dropping potential to an increasing potential at terminal 73 whereas terminal 74 receives a drecreasing potential from amplifier 67. This represents segment A of the curve shown in FIG. 9. As disc 15 is rotated in the other direction from its center position, phototransistor 37 begins receiving light from source 34 to begin conduction. As phototransistor 37 begins to conduct, the potential of its collector begins to drop which results in a decreasing potential on terminal 73 and an increasing potential on terminal 74 representing segment B of the curve shown in FIG. 9. Thus, conduction of phototransistor 36 results in a postitive output voltage across terminals 73 and 74, and conduction of phototransistor 37 results in a negative output voltage across terminals 73 and 74. Segment C represents disc travel where neither photoresponsive transistors receives light through corresponding windows 41 and 42.

Figure 10:
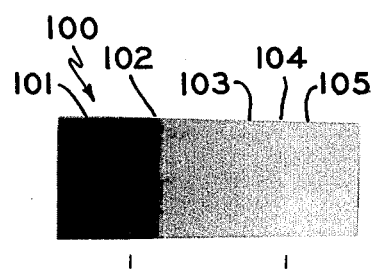
FIG. 10 shows an alternative window which profiles the slope of the response curve of the invention; and, FIG. 11 shows the response curve for the window shown in FIG. 10.
Figure 11:
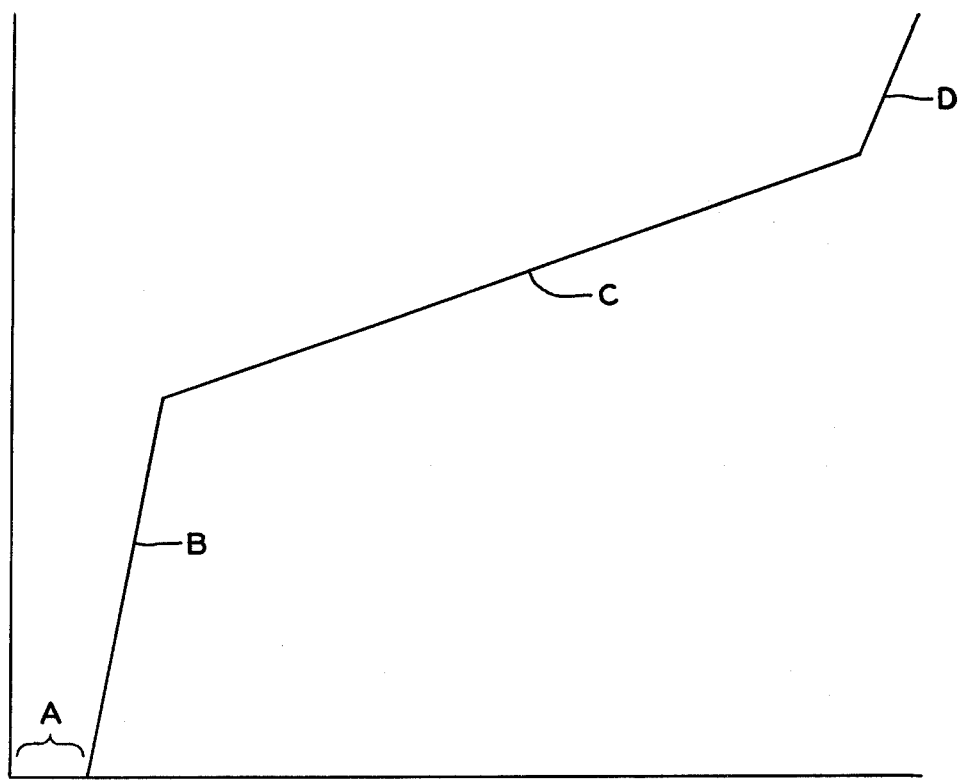

Windows 41 and 42 may be profiled in any desired manner. However, when the control handle described herein is used to control certain motors or valves which require a threshold current before their operation begins, it may be desirable to profile these windows in such a manner that the threshold current level for the motor or valve is reached very rapidly as the control handle is rotated. Such an arrangement is shown in FIGS. 10 and 11. In FIG. 10, there is shown window 100 which may be used for window 41 or 42, it being understood that a second such window 100 will be used for the other window 41 or 42. Disc 15 may be a two part disc split lengthwise so that each half has slots to form windows 41 and 42. Window 100 may be placed upon a transparency which is then sandwiched between the two halves of the disc 15 such that when the transparency is placed between the two halves of disc 15 window 100 will appear through the slots in each disc corresponding to window 41 of disc 15. In this manner, the window 41 shown in FIG. 5 will have an arcuate geometry providing that window 100 shown in FIG. 10 is sufficiently large.

Window 100 has an opaque portion 101 which corresponds to area A in FIG. 11 and provides no output response in the photocells 36 and 37. Window 100 has a further region 102 the transparency of which changes rapidly to correspond to portion B of the curve shown in FIG. 11. A further portion 103 of window 100 has a gradually changing transparency to correspond to segment C of the curve shown in FIG. 11. Region 104 of window 100 has a more rapid transparency change to correspond to segment D. Region 105 is clear and terminates any change in the response of the photocells.

In this manner, as the control handle is rotated the device which is controlled by window 100 receives its threshold current rapidly along segment B until segment C is reached. The output device controlled by window 100 is then gradually modulated along segment C.

Certain variations can be made without departing from the scope of the invention. For example, windows 41 and 42 may be mounted on two separate discs with one light source between them. The photoresponsive transistors would then be mounted on the outside of the windows. In the alternative, windows 41 and 42, as shown in FIG. 5, may be extended to meet at both ends with an extra opaque portion filling in the window between points 43 and 45 to preserve the non-overlapping feature as indicated in FIG. 9. Therefore, the invention is to be limited only by the claims.

The embodiments of the invention in which an exclusive property or right is claimed are defined as follows:

1. An optical potentiometer comprising:
    first and second variable light transmissive windows;
    light source means for supplying light to one side of said windows;
    first light responsive means positioned on the other side of said windows for receiving light emitted through said first window and second light responsive means mounted on the other side of said windows for receiving light emitted through said second windows, said first and second light responsive means mounted so that only one of said first and second light responsive means receives light at any time; and,
    means for moving said first and second variable light transmissive windows past said first and second light responsive means.

2. The optical potentiometer of claim 1 wherein said first and second light responsive means and said corresponding first and second variable light transmissive windows are arranged to provide a dwell period between the times when said first and second light responsive means receive light.

3. The optical potentiometer of claim 2 wherein each variable light transmissive window has a first end and a second end and wherein each of said first and second variable light transmissive windows becomes increasingly transparent from said first end to said second end.

4. The optical potentiometer of claim 3 wherein said windows are located in a disc which, when rotated, allows light to pass first through said first end of said first and second light transmissive windows.

5. The optical potentiometer of claim 4 wherein said first and second variable light transmissive windows have the same radius upon said disc.

6. The optical potentiometer of claim 5 wherein said means for moving said first and second variable light transmissive windows comprises a handle for rotating said disc.

7. The optical potentiometer of claim 6 wherein said first and second light responsive means comprises corresponding first and second phototransistors.

8. The optical potentiometer of claim 7 wherein said first and second light responsive means further comprises circuit means connected to said first and second phototransistors for providing a differential output in response to energization of said first and second phototransistors.

9. The optical potentiometer of claim 8 wherein said circuit means comprises first and second amplifiers connected to said first and second phototransistors for providing a positive output when said first phototransistor receives light and for providing a negative output when said second phototransistor receives light.

10. The optical potentiometer of claim 1 wherein each variable light transmissive window has a first end and a second end and wherein each of said first and second variable light transmissive windows becomes increasingly transparent from said first end to said second end.

11. The optical potentiometer of claim 10 wherein said windows are located in a disc which, when rotated, allows light to pass first through said first end of said first and second light transmissive windows.

12. The optical potentiometer of claim 11 wherein said first and second variable light transmissive windows have the same radius upon said disc.

13. The optical potentiometer of claim 12 wherein said means for moving said first and second variable light transmissive windows comprises a handle for rotating said disc.

14. The optical potentiometer of claim 13 wherein said first and second light responsive means comprises corresponding first and second phototransistors.

15. The optical potentiometer of claim 14 wherein said first and second light responsive means further comprises circuit means connected to said first and second phototransistors for providing a differential output in response to energization of said first and second phototransistors.

16. The optical potentiometer of claim 15 wherein said circuit means comprises first and second amplifiers connected to said first and second phototransistors for providing a positive output when said first phototransistor receives light and for providing a negative output when said second phototransistor receives light.

17. The optical potentiometer of claim 1 wherein said first and second light responsive means comprises corresponding first and second phototransistors.

18. The optical potentiometer of claim 17 wherein said first and second light responsive means further comprises circuit means connected to said first and second phtotransistors for providing a differential output in response to energization of said first and second phototransistors.

19. The optical potentiometer of claim 18 wherein said circuit means comprises first and second amplifiers connected to said first and second phototransistors for providing a positive output when said first phototransistor receives light and for providing a negative output when said second phototransistor receives light.

20. The optical potentiometer of claim 1 wherein said first and second light responsive means comprises circuit means including first and second light sensors for providing a differential output in response to energization of said first and second light sensors.

21. The optical potentiometer of claim 20 wherein said circuit means comprises first and second amplifiers connected to said first and second light sensors for providing a positive output when said first light sensor receives light and for providing a negative output when said second light sensor receives light.

22. The optical potentiometer of claim 1 wherein said first and second variable light transmissive windows each has a first portion having a rapidly changing transparency and a second portion having a gradually changing transparency wherein the first and second light responsive means provide rapidly changing outputs during said first portion and gradually changing outputs during said second portion.

23. The optical potentiometer of claim 22 wherein said first and second light responsive means and said corresponding first and second variable light transmissive windows are arranged to provide a dwell period between the times when said first and second light responsive means receive light.

24. The optical potentiometer of claim 23 wherein each variable light transmissive window has a first end and a second end and wherein each of said first and second variable light transmissive windows becomes increasingly transparent from said first end to said second end.

25. The optical potentiometer of claim 24 wherein said windows are located in a disc which, when rotated, allows light to pass first through said first end of said first and second light transmissive windows.

26. The optical potentiometer of claim 25 wherein said first and second variable light transmissive windows have the same radius upon said disc.

27. The optical potentiometer of claim 26 wherein said means for moving said first and second variable light transmissive windows comprises a handle for rotating said disc.

28. The optical potentiometer of claim 27 wherein said first and second light responsive means comprises corresponding first and second phototransistors.

29. The optical potentiometer of claim 28 wherein said first and second light responsive means further comprises circuit means connected to said first and second phototransistors for providing a differential output in response to energization of said first and second phototransistors.

30. The optical potentiometer of claim 29 wherein said circuit means comprises first and second amplifiers connected to said first and second phototransistors for providing a positive output when said first phototransistor receives light and for providing a negative output when said second phototransistor receives light.

* * * * *